US011501998B2

United States Patent
Kibi et al.

(10) Patent No.: US 11,501,998 B2
(45) Date of Patent: Nov. 15, 2022

(54) METHOD FOR MANUFACTURING THREE-DIMENSIONAL SEMICONDUCTOR MEMORY DEVICE

(71) Applicant: Tokyo Electron Limited, Tokyo (JP)

(72) Inventors: Kazuo Kibi, Tokyo (JP); Akihiro Takahashi, Miyagi (JP); Wataru Sakamoto, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 269 days.

(21) Appl. No.: 16/996,914

(22) Filed: Aug. 19, 2020

(65) Prior Publication Data

US 2020/0381294 A1 Dec. 3, 2020

Related U.S. Application Data

(63) Continuation of application No. PCT/JP2019/005736, filed on Feb. 18, 2019.

(30) Foreign Application Priority Data

Mar. 2, 2018 (JP) .............................. JP2018-037583

(51) Int. Cl.
*H01L 21/768* (2006.01)
*H01L 21/033* (2006.01)
*H01L 21/311* (2006.01)
*H01L 21/3213* (2006.01)
(Continued)

(52) U.S. Cl.
CPC .... *H01L 21/76816* (2013.01); *H01L 21/0332* (2013.01); *H01L 21/0335* (2013.01); *H01L 21/31116* (2013.01); *H01L 21/31144* (2013.01); *H01L 21/32135* (2013.01);
(Continued)

(58) Field of Classification Search
CPC ......... H01L 21/76816; H01L 21/31144; H01L 21/0332; H01L 21/0335; H01L 21/31116; H01L 21/32139; H01L 21/76877
See application file for complete search history.

(56) References Cited

U.S. PATENT DOCUMENTS

2016/0329345 A1\* 11/2016 Hu ................... H01L 27/11582
2017/0103996 A1   4/2017 Lee et al.
2017/0186767 A1   6/2017 Baek et al.

FOREIGN PATENT DOCUMENTS

JP        2007-266143 A        10/2007

OTHER PUBLICATIONS

Maruyama, T., "Presentation of BiCS FLASH™ Development for Analysts and Institutional Investors," Dec. 7, 2016, 15 pages (with partial translation).

\* cited by examiner

*Primary Examiner* — Walter H Swanson
(74) *Attorney, Agent, or Firm* — Xsensus LLP

(57) ABSTRACT

There is formed, on a stack formed by alternately stacking an oxide film and a nitride film or an oxide film and a polysilicon film on a substrate, a hard mask in which two or more kinds of lines made of mutually different materials are arranged in order. Then, a photoresist is applied onto the hard mask. Furthermore, the photoresist is trimmed until one line is exposed from the end of the hard mask. Moreover, one line of the hard mask exposed beneath the photoresist is etched. Furthermore, a part of the stack exposed beneath the hard mask is etched. The etching of the photoresist, the hard mask, and the stack is repeated while changing etching conditions.

11 Claims, 7 Drawing Sheets

(51) Int. Cl.
 *H01L 27/11556* (2017.01)
 *H01L 27/11582* (2017.01)
(52) U.S. Cl.
 CPC .. *H01L 21/32139* (2013.01); *H01L 21/76877* (2013.01); *H01L 27/11556* (2013.01); *H01L 27/11582* (2013.01)

FIG.6

| Core | Spacer | Space |
|---|---|---|
| a-Si | AlOx | SOC |
| HT SOC | TiOx | SOG |
| a-C | TiN | TiOx |
| | | ZrOx |
| | | TaOx |
| | | HfOx |

METHOD FOR MANUFACTURING THREE-DIMENSIONAL SEMICONDUCTOR MEMORY DEVICE

CROSS-REFERENCE TO RELATED APPLICATIONS

This application is a continuation application of International Application PCT/JP2019/005736, filed on Feb. 18, 2019, and designating the U.S., which claims priority to JP 2018-037583, filed Mar. 2, 2018, the entire contents of each are incorporated herein by reference.

FIELD

The following disclosure relates to a method for manufacturing a three-dimensional semiconductor memory device.

BACKGROUND

As a method for enhancing the integration degree of a semiconductor memory device, there are proposed a large number of semiconductor memory devices in which memory cells are arranged three-dimensionally. For example, there is known a 3D NAND-type flash memory as a semiconductor memory device in which memory cells are arranged three-dimensionally. In the following, the semiconductor memory device in which memory cells are arranged three-dimensionally is referred to as a three-dimensional semiconductor memory device.

For example, there is known a three-dimensional semiconductor memory device including a plurality of memory strings in which a plurality of memory cells are connected in series (Patent Literature 1). In such a three-dimensional semiconductor memory device, conductor layers spreading two-dimensionally are stacked on a substrate through an insulator, which forms a stair-shaped stack with one layer formed by a pair of a conductor layer and an insulator as one step. The memory strings are configured so that the memory cells connected in series are arranged in a direction penetrating the stack. Moreover, the end of the stack is formed to be stair-shaped. Each step of the stair is connected to a different driver so as to allow the conductor layer of each layer to function as a word line (Patent Literature 2).

As a method for forming the steps of the stack, there is known a method using trimming (Patent Literatures 2 and 3), for example. In this method, a photoresist is first applied onto the stack as an etch mask. Then, the uppermost layer of the stack on which no photoresist is applied is removed by anisotropic etching. Next, isotropic etching is performed so that the end on the stair side of the photoresist retreats by a given length. By the isotropic etching, the end on the stair side of the photoresist retreats by a given length, and the thickness of the photoresist is also reduced by a given amount. Then, anisotropic etching is performed on the uppermost layer exposed by retreat of the photoresist and the second layer. This processing is repeated to form a desired number of steps.

In such a three-dimensional semiconductor memory device, the number of layers of the stack is substantially equal to the number of memory cells included in the memory string. Thus, it is considered, as a method for enhancing the integration degree of the three-dimensional semiconductor memory device, that the number of layers of the stack is increased. For example, there is proposed the 3D NAND in which the number of layers of the three-dimensional semiconductor memory device is 64 (Non Patent Literature 1).

Patent Literature 1: Japanese Laid-open Patent Publication No. H2007-266143
Patent Literature 2: U.S. Unexamined Patent Application Publication No. 2017/0103996
Patent Literature 3: U.S. Unexamined Patent Application Publication No. 2017/0186767
Non Patent Literature 1: Toru Maruyama, "Presentation of BiCS FLASH™ Development for Analysts and Institutional Investors" Dec. 7, 2016, https://www.toshiba.co.jp/about/ir/jp/pr/pdf/opr20161207_3.pdf (Accessed on the Internet on Nov. 13, 2017)

However, in a case where the stair of the stack is formed using the above-described method, the photoresist formed on the stack disappears by etching repeated several times. Thus, in a case where the steps of the stack including a large number of layers is formed, the process of applying a photoresist occurs a plurality of times. For example, it is supposed that the photoresist applicable by one-time spin-on disappears after six steps of the stair of the stack are formed. In this case, in order to form the stair with 128 steps, the process of applying a photoresist is required twenty times or more.

SUMMARY

In an embodiment of a present disclosure, on a stack formed by alternately stacking an oxide film and a nitride film or an oxide film and a polysilicon film on a substrate, a hard mask including two or more kinds of lines made of mutually different materials that are arranged in order is formed. A photoresist is applied onto the hard mask. The photoresist is trimmed until one of the lines becomes exposed from an end of the hard mask. The one line of the hard mask exposed beneath the photoresist is etched. A part of the stack exposed beneath the hard mask is etched. Etching of the photoresist, the hard mask, and the stack are repeated while changing etching conditions.

BRIEF DESCRIPTION OF DRAWINGS

FIG. 6 is a diagram illustrating examples of the combination of materials used as a hard mask in the method for manufacturing a three-dimensional semiconductor memory device according to the embodiment.

DESCRIPTION OF EMBODIMENT

Figure 1:
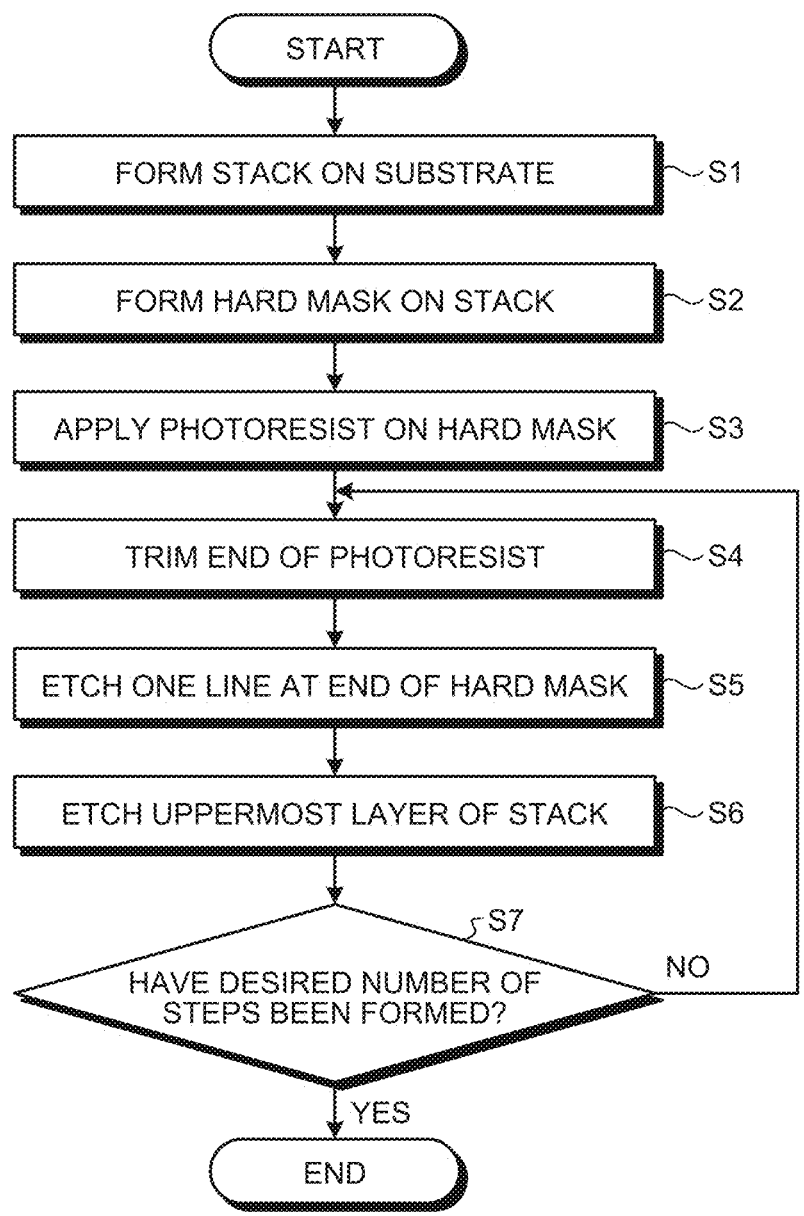
FIG. 1 is a flowchart illustrating an example of a flow of a method for manufacturing a three-dimensional semiconductor memory device according to an embodiment.

In one disclosed exemplary embodiment, the method for manufacturing a three-dimensional semiconductor memory device includes a step of forming, on a stack formed by alternately stacking an oxide film and a nitride film or an oxide film and a polysilicon film on a substrate, a hard mask including two or more kinds of lines made of mutually different materials that are arranged in order. Moreover, the method for manufacturing a three-dimensional semiconductor memory device includes a step of applying a photoresist onto the hard mask. Furthermore, the method for manufacturing a three-dimensional semiconductor memory device includes a step of repeating processing of trimming the photoresist while changing etching conditions until one of the lines becomes exposed from an end of the hard mask, processing of etching the one line of the hard mask exposed beneath the photoresist, and processing of etching a part of the stack exposed beneath the hard mask.

In one disclosed exemplary embodiment, the processing of trimming in the step of repeating may expose only one out of the lines of a same material from the end of the hard mask.

Moreover, in one disclosed exemplary embodiment, the hard mask may be made of two to four kinds of materials.

In one disclosed exemplary embodiment, the hard mask may be formed using at least one of self-aligned double patterning (SADP), self-aligned multi patterning (SAMP), and electron beam vapor deposition.

Moreover, in one disclosed exemplary embodiment, the material forming the hard mask may include at least two materials among a core material, a spacer material formed on both sides of the core material, and a space material filling a gap between the core material and the spacer material.

Moreover, in one disclosed exemplary embodiment, the core material may be amorphous silicon, heat-treated spin on carbon, or amorphous carbon. Moreover, the spacer material may be aluminum oxide, titanium oxide, or titanium nitride. Moreover, the space material may be spin on carbon, a spin on glass, titanium oxide, zirconium oxide, tantalum oxide, or hafnium oxide.

Moreover, in one disclosed exemplary embodiment, the hard mask may be made of two kinds including the core material and the space material.

In addition, in one disclosed exemplary embodiment, the hard mask may be formed of four kinds including one kind of core material, one kind of space material, and two kinds of spacer materials.

Furthermore, in one disclosed exemplary embodiment, the step of repeating may repeat processing of trimming a photoresist while changing etching conditions until one of the lines becomes exposed from an end in a same direction of each of a plurality of blocks of the hard mask, processing of etching the one line of the hard mask exposed beneath the photoresist, and a processing of etching a part of the stack exposed beneath the hard mask, so as to form stairs facing a same direction at the end in the same direction of the blocks of the stack. Moreover, the method for manufacturing a three-dimensional semiconductor memory device may further include a step of first covering to cover every other block of the blocks of the stack by an oxide film. Moreover, the method for manufacturing a three-dimensional semiconductor memory device may include a step of first continuity to perform etching on a block not covered by the oxide film so that a stair of an adjacent block and the stair of the block on which the anisotropic etching has been performed become continuous.

Moreover, in one disclosed exemplary embodiment, the method for manufacturing a three-dimensional semiconductor memory device may include a step of second covering to cover every other block with continuous stairs by an oxide film. Moreover, the method for manufacturing a three-dimensional semiconductor memory device may include a step of second continuity to perform etching on a block not covered by the oxide film so that a stair of an adjacent block and the stair of the block on which the anisotropic etching has been performed become continuous.

In addition, in one disclosed exemplary embodiment, the method for manufacturing a three-dimensional semiconductor memory device may further include repetition of the step of second covering and the step of second continuity a given number of times.

The following will describe the disclosed exemplary embodiment in detail with reference to the enclosed drawings. Note that the illustrative embodiment does not limit the disclosed invention. It is possible to appropriately combine each embodiment within a range not causing contradiction of processing contents.

(One Example of Flow of Method for Manufacturing Three-Dimensional Semiconductor Memory Device According to Embodiment)

Figure 2:
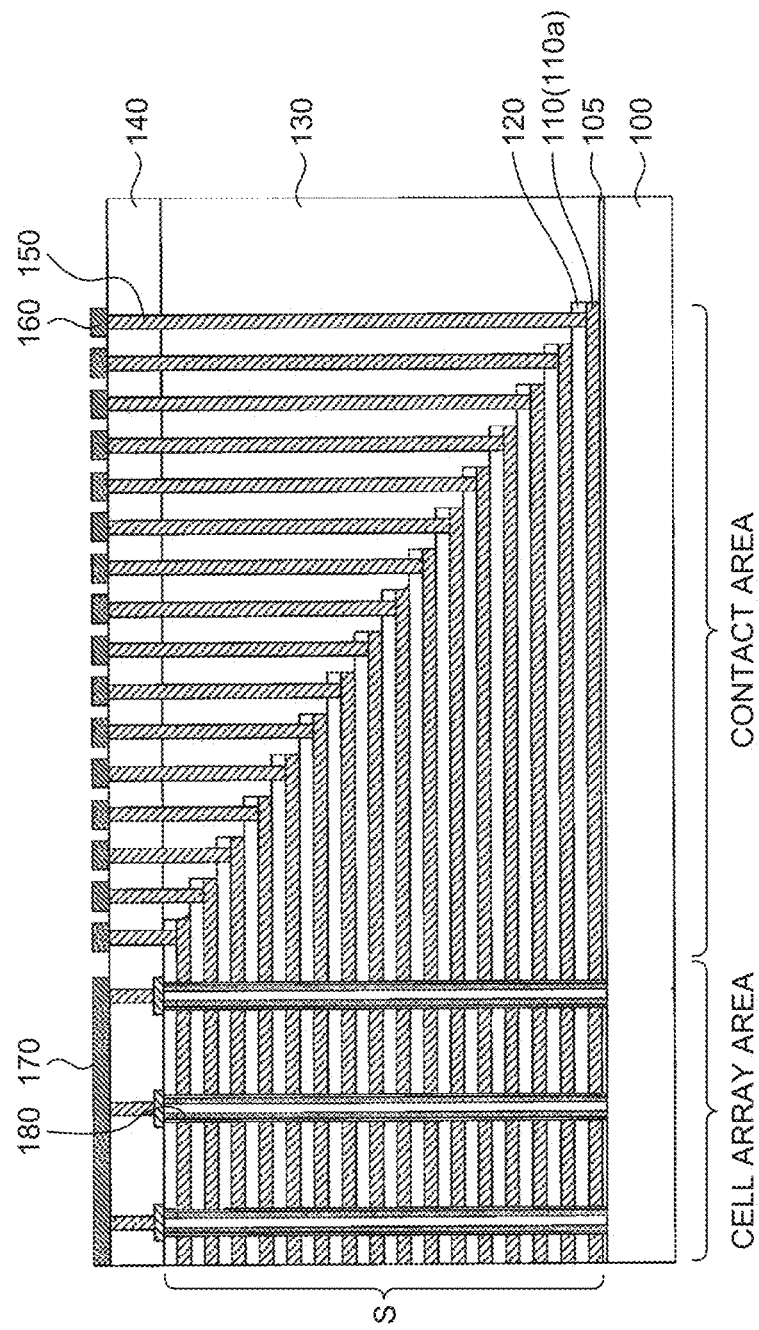
FIG. 2 is a diagram for explaining a configuration example of a three-dimensional semiconductor memory device manufactured by the method for manufacturing a three-dimensional semiconductor memory device according to the embodiment.

FIG. 1 is a flowchart illustrating an example of a flow of a method for manufacturing a three-dimensional semiconductor memory device according to the embodiment. FIG. 2 is a diagram for explaining a configuration example of a three-dimensional semiconductor memory device manufactured by the method for manufacturing a three-dimensional semiconductor memory device according to the embodiment.

The three-dimensional semiconductor memory device manufactured by the method for manufacturing a three-dimensional semiconductor memory device according to the embodiment has a configuration illustrated in FIG. 2, for example. In the example of FIG. 2, there is formed a stack S in which gate electrode layers 110 and insulator layers 120 are alternately stacked on a substrate 100 through a lower insulating layer 105. The stack S is embedded by a first interlayer insulating layer 130 and a second interlayer insulating layer 140. A contact area of the stack S is formed to be stair-shaped. A contact plug 150 is connected to a part corresponding to a step of the stair. A connection line 160 is arranged on the contact plug 150, and is connected to a circuit (not illustrated) or the like controlling a word line. A bit line 170 is arranged in a cell array area of the stack S. The bit line 170 is connected to each layer formed in a channel hole 180.

A three-dimensional semiconductor memory device 1 illustrated in FIG. 2 is one example, and the shapes and the structures of detailed parts of the three-dimensional semiconductor memory device 1 may be different from those illustrated in FIG. 2. Moreover, it is possible to form each part by any desired method, except for the method for forming the stair shape of the stack S.

First, the stack S is formed on the substrate 100 through the lower insulating layer 105 (Step S1). In the phase of stacking the stack S, the stack S is formed not by the gate electrode layers 110 and the insulator layers 120 but by sacrificial layers 110a and the insulator layers 120. The gate electrode layer 110 is formed in the later step by removing the sacrificial layer 110*a* and backfilling a gap formed by the removal.

Figure 3:
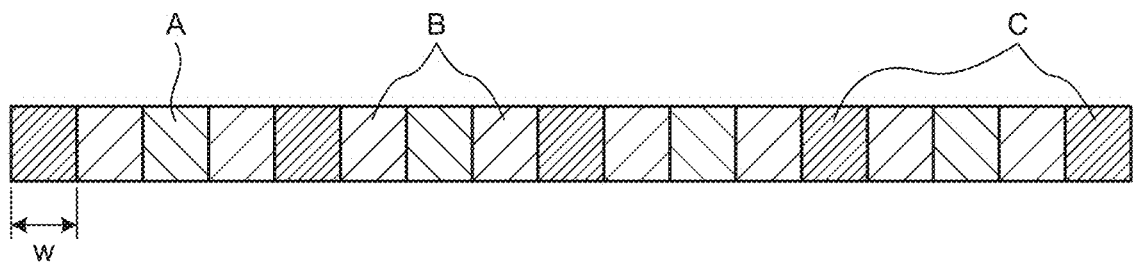
FIG. 3 is a section view of an example of a hard mask formed on a stack.

Next, a hard mask HM is formed on the stack S (Step S2, see FIG. 3). The hard mask HM has a configuration in which at least two or more different materials are arranged alternately and linearly. The details of the hard mask HM will be described later.

Next, a photoresist is applied onto the hard mask HM (Step S3).

Next, an end of the photoresist is trimmed so that one line of the hard mask HM is exposed from the end of the applied photoresist (Step S4). For example, the end of the photoresist is removed by anisotropic etching.

Then, one line at the end of the hard mask HM exposed beneath the photoresist is etched (Step S5).

Then, the uppermost layer of the stack S exposed beneath the line of the hard mask HM removed by etching, that is, a pair of the sacrificial layer 110*a* and the insulator layer 120 are removed by etching (Step S6).

Then, it is determined whether a desired number of steps have been formed in the stack S by etching (Step S7). If it is determined that a desired number of steps have been formed (Yes at Step S7), the formation of the stair of the stack S is finished. On the other hand, if it is determined that a desired number of steps have not been formed (No at Step S7), the procedure returns to Step S4 to repeat processing. In this manner, the stair of the stack S illustrated in FIG. 2 is formed.

(One Example of Configuration of Hard Mask)

The following will describe the configuration of the hard mask HM used in the manufacturing method of the embodiment. FIG. 3 is a section view of an example of the hard mask HM formed on the stack S. The hard mask HM is formed by a plurality of kinds of lines made of mutually different materials that are arranged in order. The width w of each line is substantially the same. The hard mask HM is formed on the stack S with an area substantially the same as the stack S.

In the example of FIG. 3, the hard mask HM includes three kinds of lines made of mutually different three materials. The three materials are amorphous silicon (a-Si), aluminum oxide (AlOx), and spin on carbon (SOC), for example. In the example of FIG. 3, the line of the material A (amorphous silicon) and the line of the material C (spin on carbon) are arranged alternately, and the line of the material B (aluminum oxide) is sandwiched between the line of the material A and the line of the material C. That is, the arrangement order is A-B-C-B-A-B-C-B-A. However, the arrangement order of a plurality of kinds of lines forming the hard mask HM is not especially limited.

(One Example of Method Forming Hard Mask)

Figure 4:
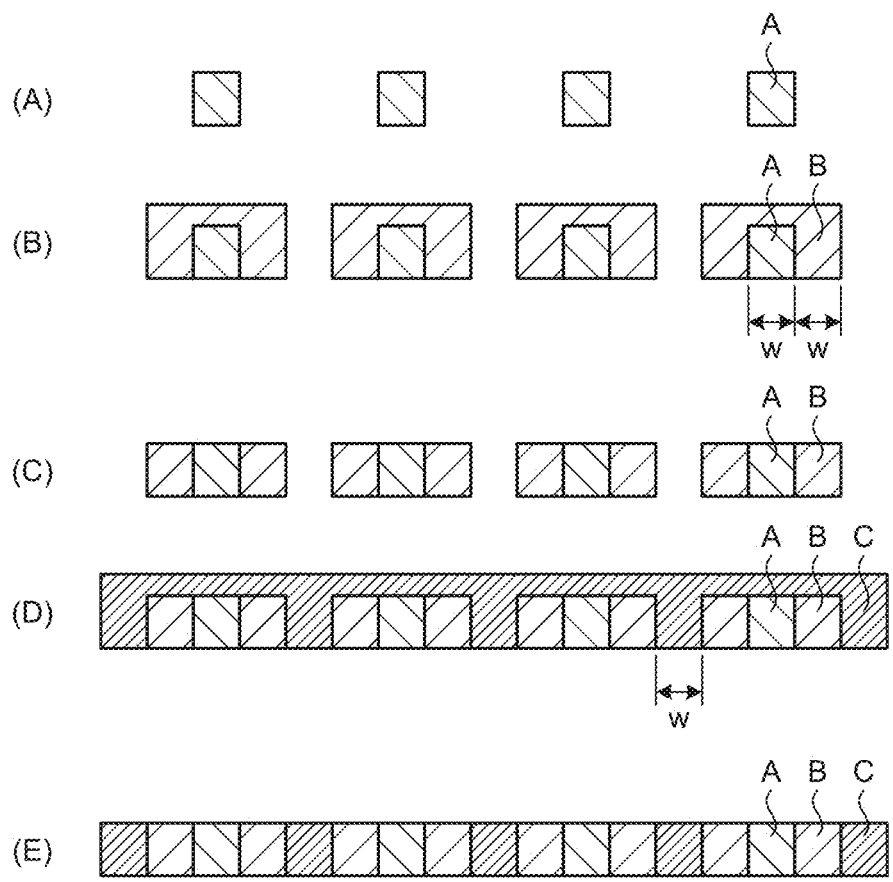
FIG. 4 is a diagram for explaining a process of forming a hard mask.

FIG. 4 is a diagram for explaining a process of forming the hard mask HM. The hard mask HM may be formed using self-aligned double patterning (SADP) or self-aligned multi patterning (SAMP), for example. Moreover, the hard mask HM may be formed by electron beam vapor deposition.

First, a pattern A of a material as a core (material A, for example) is formed by exposure or the like (FIG. 4(A)). On the pattern A, there is formed a film B of a spacer material different from the pattern A (material B, for example) so as to cover the side walls of the pattern A and have substantially the same width w as the pattern A (FIG. 4(B)). Next, the material B accumulated on the pattern A is removed by etching, so as to form a pattern in which the lines of the material B are arranged on both sides of the line of the material A (FIG. 4(C)). Then, the gap between the lines of the material B is backfilled by a space material different from the materials A, B (material C, for example) (FIG. 4(D)). The backfilling by the material C is performed by electron beam vapor deposition, for example. Then, the pattern backfilled by the material C is etched to remove the material C accumulated on the lines of the materials A, B (FIG. 4(E)). In this manner, it is possible to form the hard mask HM in which the lines are arranged in the order of the material C-B-A-B-C-B-A-B-C.

In the example of FIG. 4, the hard mask HM is formed using three kinds of different materials. However, the embodiment is not limited thereto, and the hard mask HM may be also formed using two kinds of different materials or four kinds of different materials, for example.

In a case of using two kinds of materials, the pattern A of amorphous silicon is formed, and then the gap between the pattern A may be backfilled by spin on carbon. In this case, the width of the pattern A and the width between the pattern A are made substantially same. In a case of using two kinds of materials, a material used for forming a film later may be a material allowing application by spin coating.

Moreover, in a case of using four kinds of materials, the processes of FIGS. 4(B) and (C) may be repeated twice. That is, the material B is accumulated on both walls of the core A and is then subjected to etching to obtain the shape of FIG. 4(C), and thereafter the material C is accumulated further next to B accumulated on both walls of the core A and is then subjected to etching. Subsequently, the space remaining between the lines of the material C is backfilled by a material D. In this manner, it is possible to form the hard mask HM in which the lines are arranged in the order of the material B-A-B-C-D-C-B-A-B-C-D.

(One Example of Method Forming Stair)

Figure 5:
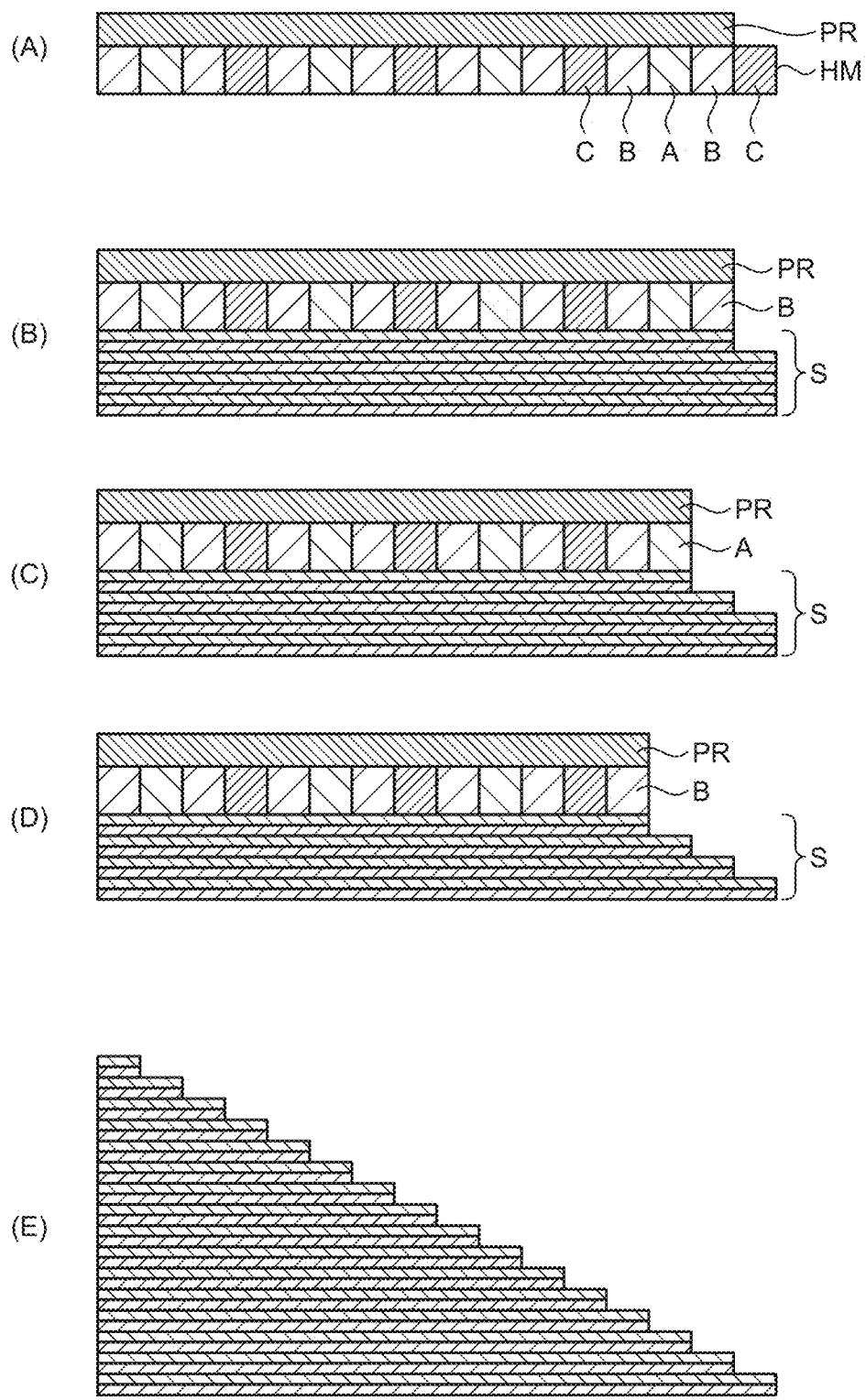
FIG. 5 is a diagram for explaining a process of forming steps.

FIG. 5 is a diagram for explaining a process of forming a stair. After the hard mask HM is formed on the stack S, as described above, the process of forming a stair of the stack S is performed. The photoresist PR is first applied onto the hard mask HM. Then, the photoresist PR is trimmed so that one line at the endmost portion of the hard mask HM is exposed beneath the photoresist PR (FIG. 5(A)). In the example of FIG. 5(A), the line of the material C at the endmost portion of the hard mask HM is exposed beneath the photoresist PR.

Next, the line of the material C at the endmost portion of the hard mask HM is removed by etching. Furthermore, the uppermost layer of the stack S exposed by removal of the line of the material C is removed by etching (FIG. 5(B)).

Then, the photoresist PR on the hard mask HM is removed by a given width. Note that for the trimming of the photoresist PR, the etching conditions are set so that the photoresist PR retreats in a width direction while suppressing reduction of the thickness of the photoresist PR.

For example, it is possible to perform trimming of the photoresist PR by dry etching. As an etching apparatus, a capacity coupling plasma (CCP) type may be adopted. One example of the etching conditions is as follows.

Etching gas: $O_2$ and $H_2$
Etching temperature: 20 to 100° C.
Etching duration: 10 to 150 sec
Etching power: 500 to 3000 W at a frequency of 13 to 60 MHz.

Subsequently, the line of the material B at the endmost portion of the hard mask HM exposed beneath the reduced photoresist PR is removed by etching. Then, the exposed stack S is etched to remove the uppermost layer of the stack S, and an end of the second layer from the upper side of the stack S is removed to expose an end of the third layer from the upper side of the stack S (FIG. 5(C)).

Next, the photoresist PR is further removed by a given width. Then, the line of the material A at the endmost portion of the hard mask HM exposed beneath the photoresist PR is removed by etching. Subsequently, the exposed stack S is etched to remove the uppermost layer of the stack S, and the second and third ends from the upper side of the stack S are removed to expose an end of the fourth layer (FIG. 5(D)).

In this manner, there are repeated the etching of the photoresist PR, the etching for removing the material at the endmost portion of the hard mask HM, and the etching of the stack S, so as to form the stair of the stack S (FIG. 5(E)).

(Examples of Materials of Hard Mask)

Here, as the material for the hard mask HM, a different material is used for each line. Then, for the etching of the hard mask HM, etchants and etching conditions are selected to etch only a line positioned at the endmost portion. Then, the trimming of the hard mask HM is performed while changing the etchants and etching conditions in accordance with the material of the line positioned at the endmost portion. Moreover, for the etching of the hard mask HM, there are selected conditions having minimum influences on the film thickness of the photoresist.

As the material for the hard mask HM, the materials illustrated in FIG. 6 are used, for example. FIG. 6 is a diagram illustrating examples of the combination of materials used as the hard mask HM in the method for manufacturing a three-dimensional semiconductor memory device according to the embodiment.

As illustrated in FIG. 6, it is possible to use, as the core material (material A of FIG. 3) of the hard mask HM, amorphous silicon (a-Si), heat-treated spin on carbon (HT SOC), and amorphous carbon (a-C). Moreover, it is possible to use, as the spacer material (material B of FIG. 3) of the hard mask HM, aluminum oxide (AlOx), titanium oxide (TiOx), and titanium nitride (TiN). Furthermore, it is possible to use, as the space material (material C of FIG. 3) of the hard mask HM, spin on carbon (SOC), spin on glass (SOG), titanium oxide, zirconium oxide (ZrOx), tantalum oxide (TaOx), and hafnium oxide (HfOx).

Moreover, in a case where the hard mask HM is formed of two kinds of materials, the core material and the space material in FIG. 6 are combined and used. This is because the spacer material is accumulated by a film forming apparatus, which may cause the filling remainder to be a void. In addition, in a case where the hard mask HM is formed of four kinds of materials, two kinds of spacer materials are selected and combined in addition to the core material and the space material in FIG. 6.

Here, it is preferable to set etching conditions so that the photoresist retreats by one line of the hard mask HM in a width direction by etching of the hard mask HM and the stack S. With such setting, it is possible to omit the process of etching the photoresist PR. Moreover, for the retreat of the photoresist PR, etching conditions are adjusted not to expose two or more lines formed of the same kind of material from the end of the hard mask HM during processing of each layer. This is because if two or more lines of the same kind of material are exposed, the stack S is trimmed also at other positions than the end of the stack S during etching of the stack S.

For example, the etching conditions of the hard mask HM and the stack S may be set as follows. First, the etching of the hard mask HM may be performed by dry etching. As an etching device, a capacity coupling plasma (CCP) type may be adopted. One example of the etching conditions is as follows.

Etching gas and gas flow volume:
(1) For core material:
$CF_4$ or $C_4F_8$ may be used.
The gas flow volume is 100 to 1000 sccm.
(2) For spacer material:
Any one of $CH_3F$, $SiCl_4$, and $Cl_2$ may be used.
The gas flow volume is 100 to 1000 sccm.
(3) For space material:
Mixed gas of Ar or He and $O_2$ may be used.
Each gas flow volume is 100 to 1000 sccm.
Etching temperature: 20 to 100° C.
Etching duration: 10 to 180 sec
Etching power: 500 to 3000 W at a frequency of 13 to 60 MHz.

Next, the etching of the stack S may be performed by dry etching, similarly to the hard mask HM. As an etching device, a capacity coupling plasma (CCP) type may be adopted. One example of the etching conditions is as follows:

(A) One example of etching conditions for a sacrificial layer in a case where the sacrificial layer is a silicon nitride film
Etching gas: $CH_2F_2$ and $Cl_2$
Gas flow volume: 100 to 400 sccm, 100 to 300 sccm
Etching temperature: room temperature
Etching power: 500 to 3000 W at a frequency of 13 to 60 MHz.

(B) One example of etching conditions for an insulating layer in a case where the sacrificial layer is a silicon oxide film
Etching gas: $CF_4$ or $C_4F_8$
Gas flow volume: 100 to 300 sccm
Etching temperature: room temperature
Etching power: 500 to 3000 W at a frequency of 13 to 60 MHz.

Effects of Embodiment

As described above, in the method for manufacturing a three-dimensional semiconductor memory device according to the embodiment, there is formed, on the stack formed by alternately stacking an oxide film and a nitride film or an oxide film and a polysilicon film on the substrate, the hard mask in which two or more kinds of lines made of mutually different materials are arranged in order. Next, in such a manufacturing method, the photoresist is applied onto the hard mask. Then, in such a manufacturing method, three kinds of processing are repeated while changing etching conditions. The first processing of three kinds of processing is processing of trimming the photoresist until one line is exposed from the endmost portion of the hard mask. The second processing of three kinds of processing is processing of etching one line of the hard mask exposed beneath the photoresist. The third processing of three kind of processing is processing of etching a part of the stack exposed beneath the hard mask. In this manner, in the method for manufacturing a three-dimensional semiconductor memory device according to the embodiment, it is possible to efficiently manufacture a three-dimensional semiconductor memory device without deteriorating throughput even when the number of layers of the three-dimensional semiconductor memory device is increased. Moreover, the photoresist does not disappear by several times of etching.

In addition, in the method for manufacturing a three-dimensional semiconductor memory device according to the embodiment, two or more lines of the same material are not exposed from the endmost portion of the hard mask at the repeating process. Thus, in the above-described manufacturing method, it is possible to form the lines of the hard mask with limited kinds of materials and efficiently perform etching.

Moreover, in the method for manufacturing a three-dimensional semiconductor memory device according to the embodiment, the hard mask may be formed of two to four kinds of materials. Thus, in such a manufacturing method, it is possible to form the lines of the hard mask with limited kinds of materials and efficiently perform etching.

Furthermore, in the method for manufacturing a three-dimensional semiconductor memory device according to the embodiment, the hard mask may be formed using at least one of self-aligned double patterning (SADP), self-aligned multi patterning (SAMP), and electron beam vapor deposition. Therefore, in the above-described manufacturing method, it is possible to form the hard mask with high accuracy.

Moreover, in the method for manufacturing a three-dimensional semiconductor memory device according to the embodiment, the material forming the hard mask may include at least two materials among a core material, a spacer material formed on both sides of the core material, and a space material filling a gap between the core material and the spacer material. Therefore, in such a manufacturing method, it is possible to efficiently form the hard mask using the core material, the spacer material, and the space material.

Moreover, in the method for manufacturing a three-dimensional semiconductor memory device according to the embodiment, the core material may be amorphous silicon, heat-treated spin on carbon, or amorphous carbon. Moreover, the spacer material may be aluminum oxide, titanium oxide, or titanium nitride. Moreover, the space material may be spin on carbon, a spin on glass, titanium oxide, zirconium oxide, tantalum oxide, or hafnium oxide. Therefore, in such a manufacturing method, it is possible to use, as the hard mask material, various materials and the combination thereof.

Moreover, in the method for manufacturing a three-dimensional semiconductor memory device according to the embodiment, the hard mask may be formed of two kinds of the core material and the space material. Therefore, in such a manufacturing method, it is possible to easily form the hard mask and perform processing. Moreover, in such a manufacturing method, it is possible to simplify etchant used for processing and processing conditions for etching.

In addition, in the method for manufacturing a three-dimensional semiconductor memory device according to the embodiment, the hard mask may be formed of four kinds including one kind of core material, one kind of space material, and two kinds of spacer materials. In this manner, in such a manufacturing method, it is possible to form a hard mask using the combination of various materials.

Alternative Example

In the above-described embodiment, the stair part of the stack is formed using the hard mask including lines made of a plurality of kinds of mutually different materials. In the method for manufacturing a three-dimensional semiconductor memory device according to an alternative example, it is possible to collectively form a given number of stairs without forming a step of each layer of the stack one by one. In the method for manufacturing a three-dimensional semiconductor memory device according to the alternative example, a given number of steps are formed in the stack and then the number of steps is further increased easily.

Figure 7:
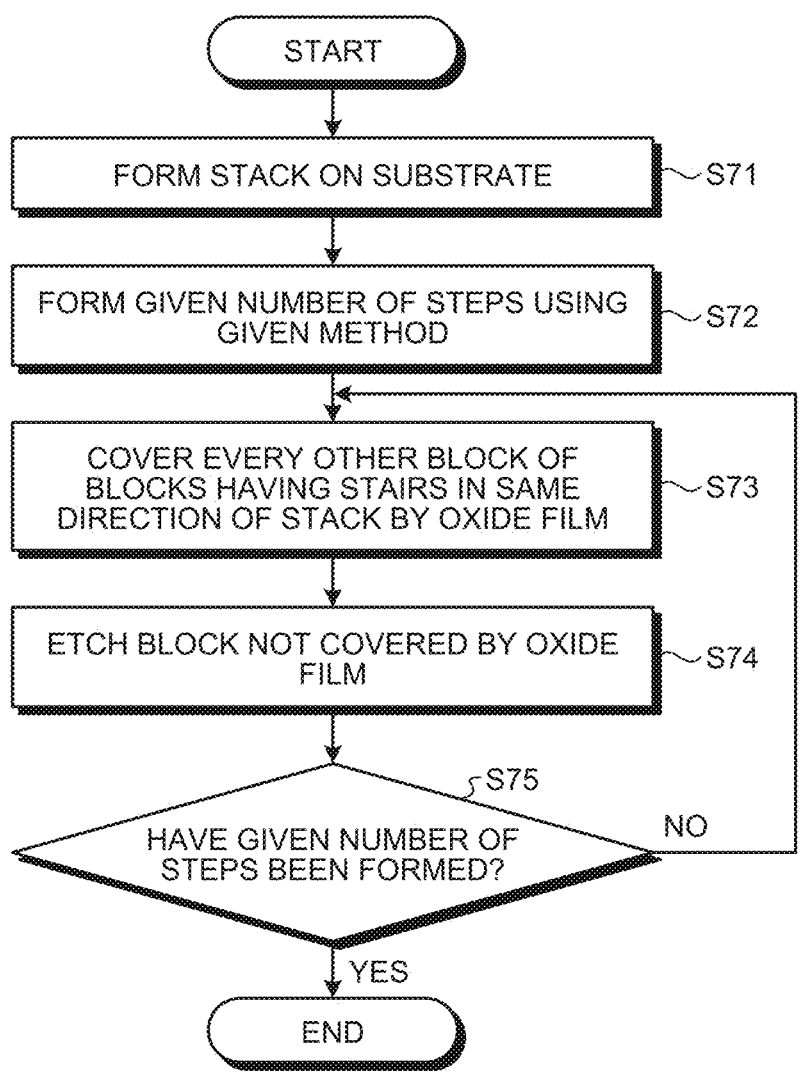
FIG. 7 is a flowchart illustrating an example of a flow of a method for manufacturing a three-dimensional semiconductor memory device according to an alternative example of the embodiment.

FIG. 7 is a flowchart illustrating an example of a flow of the method for manufacturing a three-dimensional semiconductor memory device according to the alternative example of the embodiment.

First, a stack is formed on a substrate (Step S71). The method for forming the stack is same as the method in the above-described embodiment. For example, the stack may be formed using the same method as Step S1 of FIG. 1. Next, a given number of steps are formed in the stack using a given method (Step S72). For example, the steps of the stack may be formed using the same method as Step S2 to S7 of FIG. 1. In the alternative example, a plurality of blocks are provided on one substrate. Then, a stair is formed at the end in the same direction of each block to face the same direction. Then, every other block of the blocks is covered by an oxide film (Step S73). Then, the anisotropic etching is performed until the surface of the block not covered by the oxide film reaches a height continuous to the stair of the block covered by the oxide film (Step S74). In this manner, the stairs formed in two blocks become continuous. Subsequently, it is determined whether a given number of steps are formed (Step S75). If it is determined that a given number of steps are formed (Yes at Step S75), the processing is finished. On the other hand, if it is determined that a given number of steps are not formed (No at Step S75), the procedure returns to Step S73 to repeat processing. Thus, the method for manufacturing a three-dimensional semiconductor memory device according to the alternative example is finished.

Figure 8:
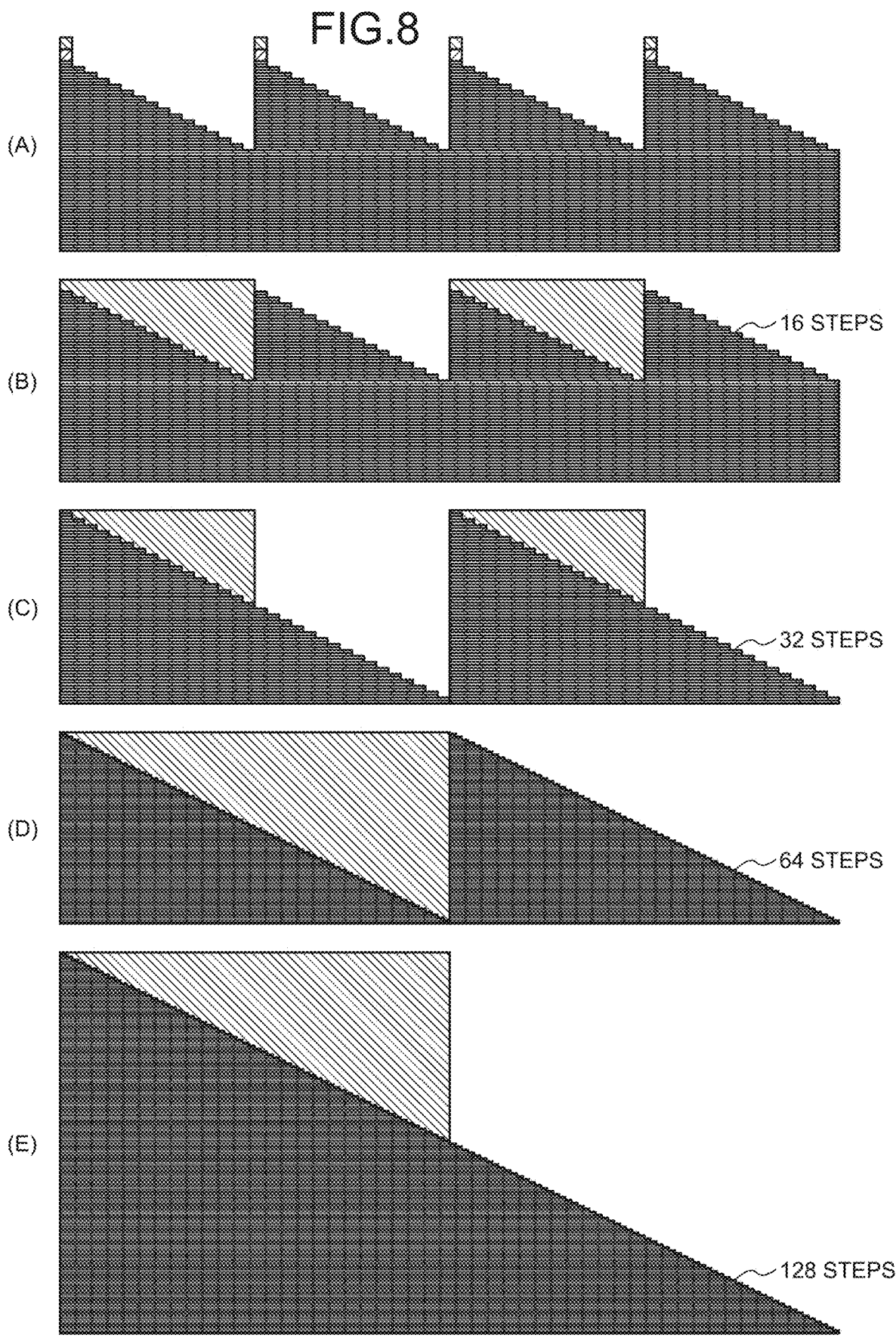
FIG. 8 is a diagram for explaining the method for manufacturing a three-dimensional semiconductor memory device according to the alternative example of the embodiment.

FIG. 8 is a diagram for explaining a method for manufacturing a three-dimensional semiconductor memory device according to the alternative example of the embodiment. FIG. 8(A) is a diagram illustrating the state where the stairs with 16 steps are formed in the stack. The stairs with 16 steps are formed at a plurality of positions to face the same direction and to be continuous in a given direction. In this phase, the stairs are arranged in a saw-toothed form on the substrate. Next, every other block with the stair is covered by an oxide film (FIG. 8(B)). Then, the anisotropic etching is performed on the block not covered by the oxide film. Then, the anisotropic etching is continued until the stair of the block covered by the oxide film and the stair of the block on which the anisotropic etching has been performed become continuous. As a result, the stairs with 32 stairs are formed in the stack, as illustrated in FIG. 8(C). Next, every other block with continuous stairs is covered by an oxide film. Then, the anisotropic etching is performed on the part not covered by the oxide film. Consequently, the stairs with 64 steps are formed, as illustrated in FIG. 8(D). Furthermore, every other stair with 64 steps is covered by an oxide film, and the block not covered by the oxide film is subjected to anisotropic etching. Then, the stair of the block covered by the oxide film and the stair of the block on which the anisotropic etching has been performed are made continuous. As a result, 128 steps are formed in the stack, as illustrated in FIG. 8(E).

Effects of Alternative Example

As described above, the method for manufacturing a three-dimensional semiconductor memory device according to the alternative example includes a process of forming stairs at the end in the same direction of a plurality of blocks to face the same direction in the stack formed by alternately stacking an oxide film and a nitride film or an oxide film and a polysilicon film on a substrate. Such a manufacturing method further includes a process of covering every other block of the blocks by an oxide film. Such a manufacturing method further includes a process of performing anisotropic etching on the block not covered by an oxide film so that the stair of the adjacent block and the stair of the block on which the anisotropic etching has been performed become continuous. In this manner, in the manufacturing method according to the alternative example, it is possible to easily form the stair of the stack with fewer processes. Therefore, in the manufacturing method according to the alternative example, it is possible to improve throughput of the three-dimensional semiconductor memory device.

Moreover, the method for manufacturing a three-dimensional semiconductor memory device according to the alternative example further includes a process of covering every other block with continuous stairs by an oxide film. In addition, such a manufacturing method further includes a process of performing anisotropic etching on the block not covered by an oxide film so that the stair of the adjacent block and the stair of the block on which the anisotropic etching has been performed become continuous. In this manner, in the manufacturing method according to the alternative example, it is possible to double the number of steps of the stack by one-time anisotropic etching. Therefore, in the manufacturing method according to the alternative example, it is possible to improve throughput of the three-dimensional semiconductor memory device.

Moreover, in the method for manufacturing a three-dimensional semiconductor memory device according to the alternative example, there are further performed repeatedly a given number of times the process of covering every other block with continuous stairs by an oxide film and the process of performing anisotropic etching on the block not covered by an oxide film so that the stair of the adjacent block and the stair of the block on which the anisotropic etching has been performed become continuous. Therefore, in such a manufacturing method, it is possible to double the number of stairs formed by one-time anisotropic etching.

Furthermore, by the combination of the method for manufacturing a three-dimensional semiconductor memory device according to the embodiment and the method for manufacturing a three-dimensional semiconductor memory device according to the alternative example, it is possible to suppress the number of manufacturing processes while improving the accuracy and reduce costs and processing burden. For example, with the conventional manufacturing method, the etching is performed 12 times in total to form the stack with six steps while applying a resist once on each stair. In this case, the resist application process is required 22 times to form the stack with 128 steps, and the etching process occurs 12 times for each resist application. Thus, the etching process occurs 256 times to form the stack with 128 steps.

Meanwhile, if the manufacturing method of the alternative example is applied, a stair with 16 steps is formed, and then anisotropic etching doubling the number of steps is performed three times, thereby forming 128 steps. Moreover, if the manufacturing method using the hard mask according to the embodiment is applied, it is possible, with 6 times of resist application and 36 times of etching, to form 128 steps. In this manner, even considering the increase of processing for forming the hard mask, it is possible to suppress costs and processing burden as a whole. Therefore, in the manufacturing methods according to the embodiment and the alternative example, it is possible to suppress the number of times of etching and the number of times of resist application and reduce costs and processing burden.

The disclosed exemplary embodiment exerts the effect of efficiently manufacturing a three-dimensional semiconductor memory device without deteriorating throughput even when the number of layers of the three-dimensional semiconductor memory device is increased.

A person skilled in the art is able to easily derive further effects and alternative examples. Thus, the broader aspects of the present invention are not limited to certain details and representative embodiments that are illustrated and described as above. Therefore, various modifications are possible without departing from the spirits or ranges of the comprehensive concept of the invention defined by the enclosed claims and the equivalents thereof.

What is claimed is:

1. A method for manufacturing a three-dimensional semiconductor memory device, comprising:
   forming, on a stack formed by alternately stacking an oxide film and a nitride film or an oxide film and a polysilicon film on a substrate, a hard mask including two or more kinds of lines made of mutually different materials that are arranged in order;
   applying a photoresist onto the hard mask; and
   repeating processing of trimming the photoresist while changing etching conditions until one of the lines becomes exposed from an end of the hard mask, processing of etching the one line of the hard mask exposed beneath the photoresist, and processing of etching a part of the stack exposed beneath the hard mask.

2. The method for manufacturing the three-dimensional semiconductor memory device according to claim 1, wherein the processing of trimming in the repeating exposes only one out of the lines of a same material from the end of the hard mask.

3. The method for manufacturing the three-dimensional semiconductor memory device according to claim 1, wherein the hard mask is made of two to four kinds of materials.

4. The method for manufacturing the three-dimensional semiconductor memory device according to claim 1, wherein the hard mask is formed using at least one of self-aligned double patterning (SADP), self-aligned multi patterning (SAMP), and electron beam vapor deposition.

5. The method for manufacturing the three-dimensional semiconductor memory device according to claim 1, wherein the materials forming the hard mask include at least two materials among a core material, a spacer material formed on both sides of the core material, and a space material filling a gap between the core material and the spacer material.

6. The method for manufacturing the three-dimensional semiconductor memory device according to claim 5, wherein
   the core material is amorphous silicon, heat-treated spin on carbon, or amorphous carbon,
   the spacer material is aluminum oxide, titanium oxide, or titanium nitride, and
   the space material is spin on carbon, a spin on glass, titanium oxide, zirconium oxide, tantalum oxide, or hafnium oxide.

7. The method for manufacturing the three-dimensional semiconductor memory device according to claim 5, wherein the hard mask is made of two kinds including the core material and the space material.

8. The method for manufacturing the three-dimensional semiconductor memory device according to claim 5, wherein the hard mask is made of four kinds including one kind of the core material, one kind of the space material, and two kinds of the spacer material.

9. The method for manufacturing the three-dimensional semiconductor memory device according to claim 1, wherein the repeating repeats processing of trimming the photoresist while changing the etching conditions until the one of the lines becomes exposed from an end in a same direction of each of a plurality of blocks of the hard mask, processing of etching the one line of the hard mask exposed beneath the photoresist, and processing of etching a part of the stack exposed beneath the hard mask, so as to form stairs facing a same direction at the end in the same direction of the blocks of the stack, and the method further includes first covering every other block of the blocks of the stack by an oxide film, and first connecting a stair of an adjacent block and the stair of the block on which the anisotropic etching has been performed by performing anisotropic etching on a block not covered by the oxide film.

10. The method for manufacturing the three-dimensional semiconductor memory device according to claim 9, further comprising:

second covering every other block of the blocks with continuous stairs by an oxide film; and second connecting a stair of an adjacent block and the stair of the block on which the anisotropic etching has been performed by performing anisotropic etching on a block not covered by the oxide film.

11. The method for manufacturing the three-dimensional semiconductor memory device according to claim 10, further comprising:

repeating the covering and the second connecting a given number of times.

\* \* \* \* \*